United States Patent [19]

Halder et al.

[11] Patent Number: 4,749,941

[45] Date of Patent: Jun. 7, 1988

[54] CIRCUIT ARRANGEMENT FOR A METER FOR MEASURING TWO ELECTRICAL QUANTITIES

[75] Inventors: Mathis Halder, Baar; Robert Oldigs, Zug, both of Switzerland

[73] Assignee: LGZ Landis & Gyr ZUG AG, Zug, Switzerland

[21] Appl. No.: 49,716

[22] Filed: May 12, 1987

[30] Foreign Application Priority Data

May 20, 1986 [CH] Switzerland ............... 2059/86

[51] Int. Cl.$^4$ .................. G01R 21/00; G01R 11/32
[52] U.S. Cl. ................................. 324/142; 324/116; 324/103 R
[58] Field of Search ............... 324/116, 103 R, 142; 340/637; 364/483, 492; 336/180, 182, 183

[56] References Cited

U.S. PATENT DOCUMENTS 3,688,232  8/1972  Szatmari ............... 336/180 X
3,875,509  4/1975  Milkovic ............... 324/142 X

OTHER PUBLICATIONS

"Landis & Gyr-Mitteilungen", 32nd year (1985), 1, Tariff Calculators Tarigyr 400, pp. 4–8.

*Primary Examiner*—Reinhard J. Eisenzopf
*Assistant Examiner*—Vinh P. Nguyen
*Attorney, Agent, or Firm*—Marmorek, Guttman & Rubenstein

[57] ABSTRACT

A circuit arrangement for the input circuit of a meter for simultaneously measuring two electrical quantities is disclosed. The circuit includes a current transformer including a primary winding, two substantially equal secondary windings and a pulse amplitude modulator associated with each secondary winding. Connections are made from each secondary winding to one terminal of its associated and non-associated pulse amplitude modulators, respectively. The circuit can be manufactured simply and economically while providing a high quality meter. Other embodiments provide additional advantages.

6 Claims, 2 Drawing Sheets

CIRCUIT ARRANGEMENT FOR A METER FOR MEASURING TWO ELECTRICAL QUANTITIES

FIELD OF THE INVENTION

The invention relates to a circuit arrangement for a meter for simultaneously measuring two electrical quantities, and particularly to a circuit arrangement which is simple, relatively small and economical while maintaining high accuracy.

BACKGROUND OF THE INVENTION

A measuring instrument of the type disclosed herein can be used for simultaneously measuring two different types of energy or power, such as active energy, reactive energy and apparent energy or active power, reactive power, and apparent power. In addition, different combinations of these quantities can be measured. The measuring instrument can be an electrical meter including a pulse width modulator which can measure active energy and reactive energy simultaneously. It is not necessary for the reactive energy to be measured directly. It can be measured indirectly, for example, in a conventional Q-meter in which a Q-value is measured and is related mathematically to the measured active energy to obtain the reactive energy value.

A circuit arrangement of the type mentioned above is commercially available, and has been described at least obliquely in the periodical "Landis & Gyr - Mitteilungen", 32nd year (1985), 1, "Tariff Calculators TARI-GYR 400," at pages 4 to 8.

SUMMARY OF THE INVENTION

The invention provides a circuit arrangement for the input circuit of a meter for simultaneously measuring two electrical quantities such as active and reactive energy. The embodiments disclosed herein enable the meter to be manufactured simply and economically. Furthermore, the circuit arrangement can be made physically small.

In one embodiment, the invention includes a primary winding, two substantially equal secondary windings associated with the primary winding, and a pulse amplitude modulator associated with each secondary winding. One terminal of each secondary winding is connected to one terminal of its associated pulse amplitude modulator. The other terminal of each of the secondary windings is connected to the other terminal of the non-associated pulse amplitude modulator.

In a second embodiment, the invention includes first and second primary windings, first and second secondary windings, and a pulse amplitude modulator associated with each secondary winding.

The first primary and first secondary windings are associated with each other. In addition, the second primary and second secondary winding are associated with each other and have a voltage ratio of about unity. Each secondary winding is connected by way of two connections to its associated pulse amplitude modulator. The connection from one terminal of the first secondary winding to one terminal of its associated pulse amplitude modulator includes the second primary winding.

A third embodiment can be realized by adding to the second embodiment a third secondary winding substantially the same size as the first secondary winding and also associated with the first primary winding. The connection between one terminal of the second secondary winding and one terminal of its associated pulse amplitude modulator includes the third secondary winding. In addition, the second primary and second secondary windings are wound in opposite directions to each other. In this circuit arrangement, the pulse amplitude modulators are not connected together directly and this may be advantageous to some uses of a meter using this circuit arrangement.

BRIEF DESCRIPTION OF THE DRAWINGS

Examples of embodiments according to the invention are described herein in further detail with reference to the drawings, in which.

Identical reference numbers designate identical parts in all drawings.

Only single-phase switches are described in the embodiments herein. However, the disclosed switches can also be used in three-phase circuit arrangements.

DESCRIPTION OF THE INVENTION

Figure 1:
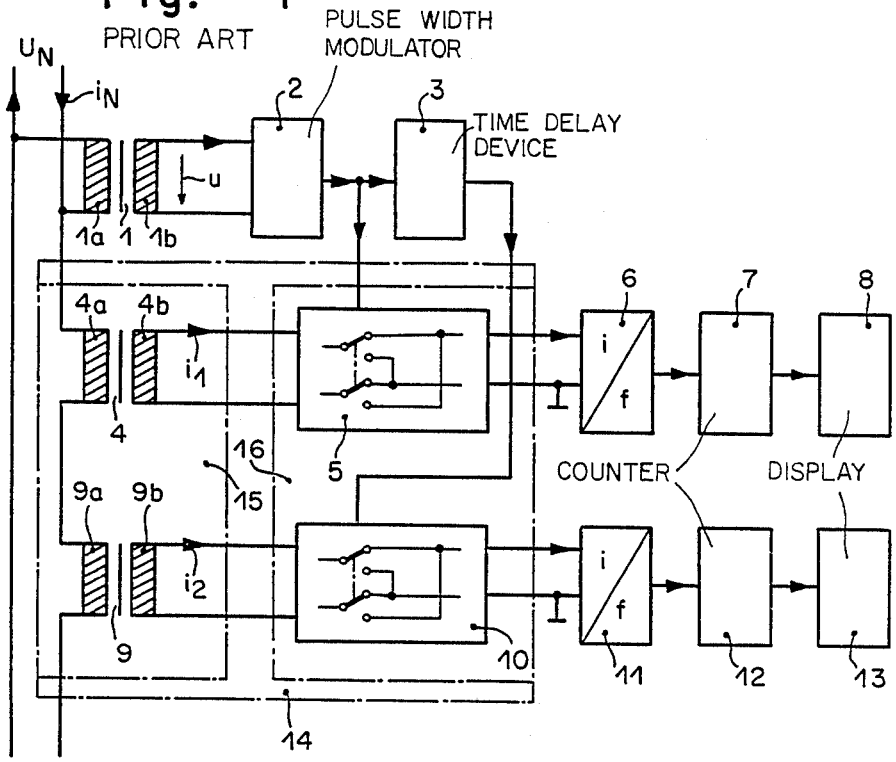
FIG. 1 is a block diagram of a prior art measuring instrument.

In the design of a combined measuring instrument or meter for the measurement of two types of energies or powers such as active and reactive power, it is known to use two separate measuring instruments and to install them in the same housing. A block diagram of a prior art combined measuring instrument is shown in FIG. 1. A voltage measuring circuit including blocks 1; 2; 3 has not been drawn twice in FIG. 1, for the sake of simplification.

The measuring instrument shown in FIG. 1 includes at least one voltage transformer 1, a pulse width modulator 2, a time delay device 3, a current transformer 4, a first pulse amplitude modulator 5, a first current to frequency converter 6, a first counter 7, and a first display device 8. In addition, the instrument includes a second current transformer 9, a second pulse amplitude modulator 10, a second current to frequency converter 11, a second counter 12 and a second display device 13.

A primary winding 1a of the voltage transformer 1 is connected by two lines to a network alternating voltage (AC) supply $U_N$ and secondary winding 1b is connected to the input circuit of the pulse width modulator 2. The voltage transformer 1, the pulse width modulator 2 and the time delay device 3 follow each other in tandem connection and together constitute a circuit 1; 2; 3 common to both measuring circuits.

The output of the pulse width modulator 2 is connected to a control input circuit of the first pulse amplitude modulator 5 and the output of the time delay device 3 is connected to a control input of the second pulse amplitude modulator 10. Binary, rectangular pulses are produced by the pulse width modulator 2. The duration of the pulses are modulated in time by the sinusoidal network alternating voltage $U_N$ or by an output voltage u of the voltage transformer 1 which is proportional to the network alternating voltage $U_N$. The pulse width modulated output pulses of the pulse width modulator 2 are delayed in time in the time delay device 3, and this delay correlates with a displacement of phase of voltage u.

The voltage measuring circuit 1; 2; 3 can also be arranged in a different way. For example, the displacement of phase of the voltage u can also take place before the pulse width modulator 2. In that case, however, two pulse width modulators, one for the voltage with phase delay and one for the voltage without phase delay, are required. Another known design for the circuit 1; 2; 3 is shown in FIG. 1 of FR-OS No. 2541463. In it, a control circuit is used to set the displacement of the phase delay.

Current transformer-primary windings 4a and 9a of the two current transformers 4 and 9 in FIG. 1 are in electrical serial connection and are energized by an identical network alternating current $i_N$. A current transformer-secondary winding 4b of the first current transformer 4 is connected from its two terminals to the input of the first pulse amplitude modulator 5.

A current transformer secondary winding 9b of the second current transformer 9 is connected from its two output terminals to the input of the second pulse amplitude modulator.

The first current transformer 4, the first pulse amplitude modulator 5, the first current to frequency converter 6, the first counter 7 and the first display device 8 are connected in tandem and, together, constitute a first measuring circuit 4; 5; 6; 7; 8 which can, for example, measure active energy or active power output. For this reason, the control input of the first pulse amplitude modulator 5 is controlled directly from the output of the pulse width modulator 2 by means of non-delayed binary pulse-width modulated pulses.

The second current transformer 9, the second pulse amplitude modulator 10, the second current to frequency converter 11, the second counter 12 and the second display device 13 are also connected in tandem and, together, constitute a second measuring circuit 9; 10; 11; 12; 13 which serves to measure reactive energy or reactive power. In this case, the delay period produced by the time delay device 3 corresponds to a phase angle of about 90° of the voltage u and the control input of the second pulse amplitude modulator 10 is controlled from the output signal of the time delay device 3.

The output pulse signals of the two pulse amplitude modulators 5 and 10 are each amplitude modulated with the secondary currents $i_1$ and $i_2$ of the current transformers 4 and 9, respectively. These secondary currents are each proportional to the network alternating current $i_N$. The two pulse amplitude modulators 5 and 10 are used as multipliers, because the amplitude variations in time of their output pulse signals are each proportional to the product $i_1 \times u$ or $i_2 \times u\underline{|90°}$ and thereby in proportion to the active output or the reactive output, respectively. The voltage $u\underline{|90°}$ is equivalent to the voltage u with a 90° displacement of phase.

Each of the two pulse amplitude modulators 5 and 10 comprises a bipolar switch which in one position passes the input signal unchanged and in the other position reverses the polarity of the input signal. Such bipolar switches can be implemented with controllable semiconductor switches.

The secondary currents $i_1$ and $i_2$ are coupled to the bipolar inputs of the current to frequency converters 6 and 11, respectively, each via its respective bipolar switch. One input terminal of each current-to-frequency converter is grounded. The secondary currents are converted through integration into frequencies $f_1$ and $f_2$, respectively, in proportion to the active or reactive output. Binary counters 7 and 12 count the binary output pulses of the current to frequency converters 6 and 11, respectively, over a predetermined period of time and the values are then displayed by display device 8 and 13, respectively. The displayed value of the first display device 8 can be equal to the measured active energy or active power depending on the counting period. Similarly, displayed value of the second display device 13 can be the reactive energy or reactive power.

In FIG. 1, input circuit arrangement 14 includes two current transformers 4 and 9 and the two pulse amplitude modulators 5 and 10. In addition, the two current transformer 4 and 9 constitute an input circuit 15 and the two pulse amplitude modulators 5 and 10 constitute an output circuit arrangement 16. The utilization of two separate current transformers 4 and 9 in the prior art circuit arrangements is space consuming and costly. In order to avoid this, the invention disclosed herein can be used.

Figure 2:
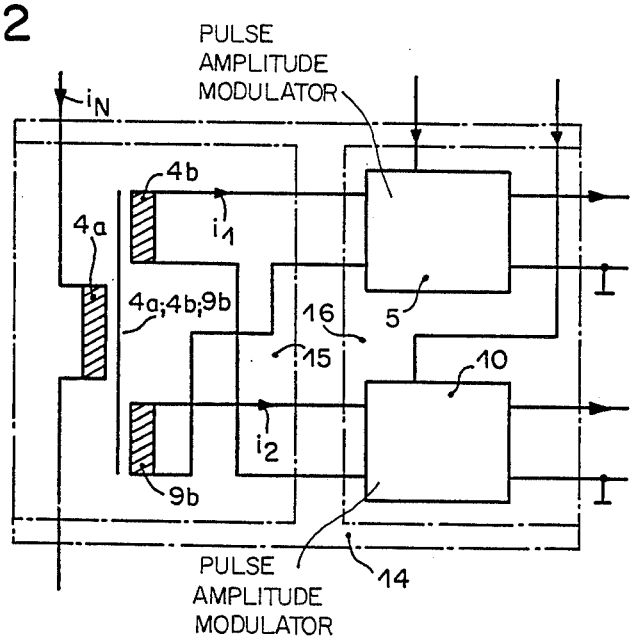
FIG. 2 is a block diagram of one embodiment of the invention.

FIG. 2 shows an embodiment of the invention which includes a circuit arrangement 14, comprising an input circuit 15 and an output circuit 16. The output circuit 16 is constituted and wired as shown in FIG. 1. The input circuit 15 in FIG. 2 includes a single current transformer 4a; 4b; 9b with a current transformer primary winding 4a and two current transformer secondary windings 4b and 9b of equal, or at least nearly equal size. Each of the two current transformer-secondary windings 4b and 9b is associated with one of the pulse amplitude modulators 5 or 10 in the circuit 16. A first terminal of each current transformer-secondary winding 4b or 9b is connected to a first terminal of the signal input of the corresponding pulse amplitude modulator 5 or 10. The second terminal of each current transformer-secondary winding 4b or 9b is connected to a second terminal of the signal input of the other pulse amplitude modulator 10 or 5 which is not associated with it.

The current transformer-primary winding 4a in FIG. 2 replaces the serial connection of the two primary windings 4a and 9a of FIG. 1 and is traversed by the network alternating current $i_N$. For the embodiment of FIG. 2, one current transformer can be eliminated without adversely disturbing the current supply to the pulse amplitude modulators 5 and 10. This is advantageous to the dynamics of the measuring instrument. Connections of the current transformer-secondary windings 4b and 9b also make it possible to avoid winding variations of these two windings 4b and 9b from causing unequal input currents in the current to frequency converters 6 and 11. The median values of the input currents considered over a period of time are equal in magnitude, even if there are differences in the windings.

If the two bipolar switches of FIG. 2 which correspond to the two pulse amplitude modulators 5 and 10 are in the positions shown in FIG. 1, the input resistance of the first current to frequency converter 6 is traversed exclusively by the secondary current $i_1$ and the input circuit of the second current to frequency converter 11 is exclusively traversed by the secondary current $i_2$, because the bipolar switches act in either case as a short circuit for the other secondary current $i_1$ or $i_2$.

The bipolar switch of the pulse modulator 5 of FIG. 2 changes its position under the influence of the output signal of the pulse width modulator 2 shown in FIG. 1. Nothing is changed electrically in the input resistance of the second current to frequency converter 11 when the pulse amplitude modulator 5 changes because it continues to be traversed exclusively by the secondary current $i_2$ so long as the reversing switch of the second pulse amplitude modulator 10 continues to maintain its position. However, the secondary current $i_2$ instead of $i_1$ will flow in the input resistance of the first current to frequency converter 6.

The first current to frequency converter 6 includes an integrator (not shown); thus, the output signal constitutes a median value $(_1T/2)-(-i_2T/2))/T=(i_1+i_2)/2$ during two consecutive half-waves of the output signal of the pulse width modulator 5 over period T. The output signal constitutes a frequency at the output of the current to frequency converter 6 which is proportional to the network alternating current $i_N$ which, in turn, is proportional to $i_1+i_2$. The input current of the first current to frequency converter 6 is thus independent of asymmetries in winding of the two secondary windings 4b and 9b of the current transformer 4a; 4b; 9b and, in its median value, is always proportional to the network alternating current $i_N$. Similar considerations lead to comparable results in the second current to frequency converter 11.

Figure 3:
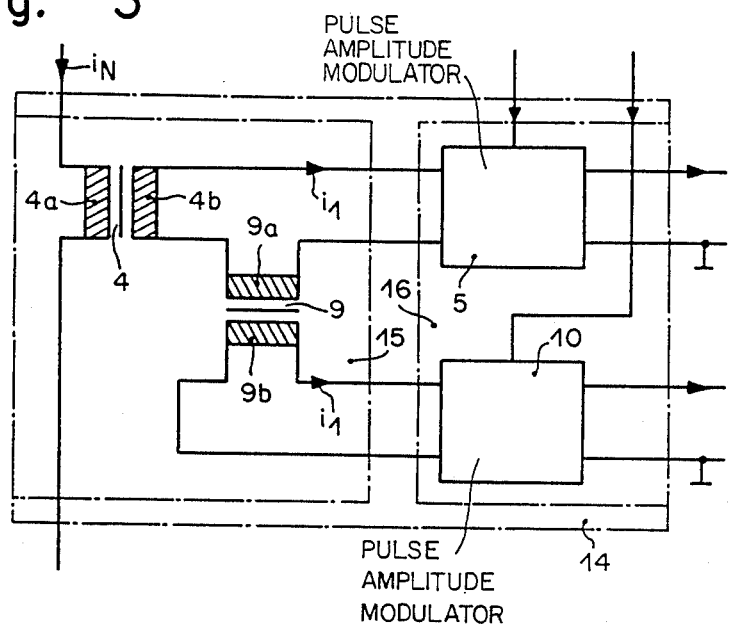
FIG. 3 is a block diagram of a second embodiment of the invention.

The second embodiment of the invention, as shown in FIG. 3, is designed similarly to the first embodiment. The difference in FIG. 3 is that the input circuit 15, in addition to a first current transformer, includes a second current transformer 9, the voltage ratio of which is nearly unity. Each of the current transformers 4 and 9 is provided with a primary winding 4a or 9a and each with a single secondary winding 4b or 9b. Each current transformer-secondary winding 4b or 9b is connected with the signal input of its corresponding pulse amplitude modulator 5 or 10. The second terminal of the current transformer-secondary winding 4b of the first current transformer 4 is connected to the second terminal of the signal input of its corresponding pulse amplitude modulator 5 via the primary winding 9a of the second current transformer 9.

The secondary current $i_1$ of the first current transformer 4 is coupled to the first current to frequency converter 6 via the first pulse amplitude modulator 5 and via both the second current transformer 9 and the second pulse amplitude modulator 10 to the second current to the frequency converter 11. The input current to the pulse amplitude modulator 10 is at least closely equal to the secondary current $i_1$ of the first current transformer 4, because the voltage ratio of the second current transformer 9 is equal to unity. The second current transformer 9 is an auxiliary transformer which does not have to support any primary/secondary surge voltages and can therefore be much smaller than the first transformer 4.

Figure 4:
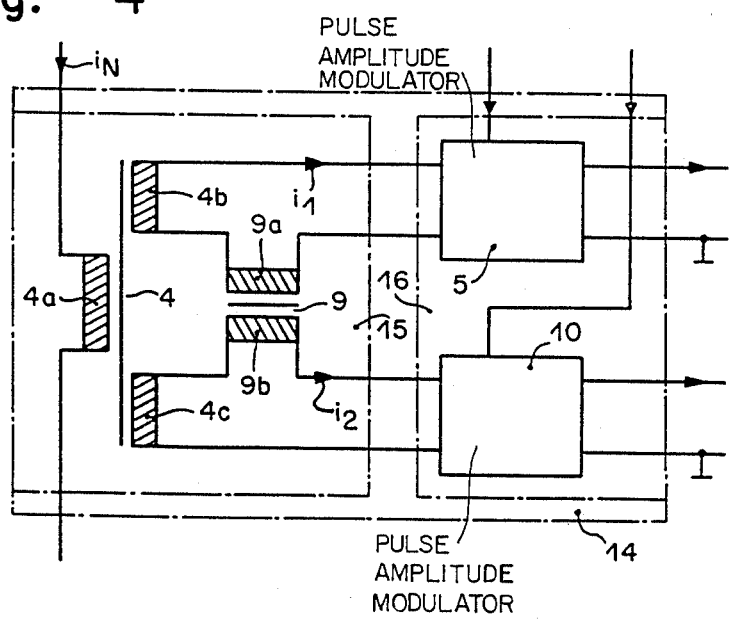
FIG. 4 is a block diagram of a third embodiment of the invention.

The third embodiment of the invention as shown in FIG. 4, resembles the second embodiment with the difference that the first current transformer 4 is provided with an additional current transformer-secondary winding 4c which is nearly the same size as the other current transformer-secondary winding of the first current transformer 4. In addition, a terminal of the current transformer-secondary winding 9b of the second current transformer is connected to a terminal of the signal input of the corresponding pulse amplitude modulator 10 via the current transformer-secondary winding 4c of the first current transformer 4.

A secondary current $i_1$ and $i_2$ of the first current transformer 4 flows in each of the input resistances of the two current to frequency converters 6 and 11, respectively. Both secondary currents $i_1$, $i_2$ are only nearly equal in magnitude without the presence of the second current transformer 9. The winding ratio of the second current transformer 9 is again nearly equal to unity, but the windings of the two current transformer windings 9a and 9b are in opposite directions.

When the two secondary currents $i1$ and $i2$ are exactly of same magnitude, each of them induces a voltage of opposite polarity in each of the two current transformer-secondary windings 9a and 9b and the voltages cancel each other out in each of the two current transformer-windings 9a and 9b. If the secondary currents $i_1$ and $i_2$ are, however, slightly different, then the two voltages induced in each of the two current transformer-secondary windings 9a and 9b are also slightly different, and their difference is thus other than zero. Each of these voltage differences produces an additional current in its corresponding circuit 9a; 4b or 9b; 4c. The additional current adds itself in one of the two circuits 9a; 4b and 9b; 4c to the corresponding secondary current $i_1$ or $i_2$ and is subtracted from the corresponding secondary current $i_2$ or $i_1$ in the other circuit. Thus, the resultant current flowing in each of the two circuits 9a; 4b and 9b; 4c is again of about the same size in both circuits 9a; 4b and 9b; 4c. The second current transformer 9 thus functions as a regulator which keeps the currents in the two circuits 9a; 4b and 9b; 4c substantially equal in magnitude.

The secondary windings 4b and 4c of the first current transformer 4 in this third embodiment need only have half as many windings as the secondary winding 4b in the second embodiment. Accordingly, the first current transformers 4 of these two embodiments differentiate themselves from each other in their design insofar as the third embodiment of the first current transformer 4 is provided with two more output terminals than the second embodiment. Otherwise, the third embodiment possesses the same advantages as the first embodiment, plus the advantage that both pulse amplitude modulators 5 and 10 are not directly connected to each other electrically.

Finally, the above described embodiments of the invention are intended to be illustrative only. Numerous alternative embodiments may be devised by those skilled in the art without departing from the spirit and scope of the following claims.

We claim:

1. A circuit arrangement for the input circuit of a meter for simultaneously measuring two electrical quantities, comprising:
    a primary winding having two terminals;
    two substantially equal secondary windings associated with said primary winding; each secondary winding having two terminals;
    a pulse amplitude modulator associated with each of said secondary windings; each pulse modulator having two terminals;
    first means for coupling one terminal of each of said secondary windings to one terminal of its associated pulse amplitude modulator; and
    second means for coupling the other terminal of each of said secondary windings to the other terminal of its non-associated pulse amplitude modulator.

2. A circuit arrangement for the input circuit of a meter for simultaneously measuring two electrical quantities, comprising:
    first and second primary windings;
    first and second secondary windings; said first primary and said first secondary winding being associated with each other; said second primary winding and said second secondary winding being associated with each other and having a voltage ratio of about unity;

a pulse amplitude modulator associated with each of said secondary windings; and coupling means for coupling each of said secondary windings by way of two poles to its associated pulse amplitude modulator;

said coupling means including said second primary winding in the coupling between said first secondary winding and its associated pulse amplitude modulator, 3. The circuit arrangement of claim 2, further comprising a third secondary winding substantially the same size as said first secondary winding and being associated with said first primary winding; said coupling means including said third secondary winding in the coupling between said second secondary winding and its associated pulse amplitude modulator, said second primary winding and said second secondary winding being wound in opposite directions from each other.

4. A circuit arrangement for the input circuit of a meter for simultaneously measuring two electrical quantities, comprising:

a current transformer including a primary winding and two substantially equal secondary windings; each of said secondary windings having two output terminals;

two pulse amplitude modulators; each of said pulse amplitude modulators having two input terminals;

first means for connecting one output terminal of one secondary winding to one input terminal of one pulse amplitude modulator and for connecting the other output terminal of the one secondary winding to one input terminal of the other pulse amplitude modulator; and second means for connecting one output terminal of the other secondary winding to the other input terminal of the one pulse amplitude modulator and for connecting the other output terminal of the other secondary winding to the other input terminal of the other pulse amplitude modulator.

5. A circuit arrangement for the input circuit of a meter for simultaneously measuring two electrical quantities, comprising:

a first current transformer including first primary and first secondary windings; the secondary winding of said first current transformer having two output terminals;

a second current transformer including second primary and second secondary winding having a voltage ratio of about unity; said second primary and said second secondary windings having two input and two output terminals, respectively;

two pulse amplitude modulators; each of said pulse amplitude modulator having two input terminals;

first means for connecting one output terminal of said first secondary winding to one input terminal of one pulse amplitude modulator and for connecting the other output terminal of said first secondary winding to one input terminal of said second primary winding;

second means for connecting the other input terminal of said second primary winding to the other input of the one pulse amplitude modulator; and third means for connecting the output terminals of said second secondary winding to the respective input terminals of the other pulse amplitude modulator.

6. A circuit arrangement for the input circuit of a meter for simultaneously measuring two electrical quantities, comprising:

a first current transformer including a first primary winding and two substantially equal first secondary windings; each of said first secondary windings having two output terminals;

a second current transformer including second primary and second secondary windings oppositely wound with respect to each other; said second primary and said second secondary windings having input and output terminals, respectively;

two pulse amplitude modulators; each of said pulse amplitude modulators having two input terminals;

first means for connecting one output terminal of one first secondary winding to one input terminal of said second primary winding and for connecting the other output terminal of the one first secondary winding to one input terminal of one pulse amplitude modulator;

second means for connecting the other input terminal of the second primary winding to the other input terminal of the one pulse amplitude modulator;

third means for connecting one output terminal of the other first secondary winding to one output terminal of said second secondary winding and for connecting the other output terminal of the other first secondary winding to one input terminal of the other pulse amplitude modulator; and fourth means for connecting the other output terminal of said second secondary winding to the other input terminal of the other pulse amplitude modulator.

* * * * *